United States Patent
Tanaka et al.

(10) Patent No.: US 6,341,645 B1
(45) Date of Patent: Jan. 29, 2002

(54) COOLING DEVICE BOILING AND CONDENSING REFRIGERANT

(75) Inventors: Hiroshi Tanaka; Tadayoshi Terao, both of Toyoake; Kiyoshi Kawaguchi, Toyota; Takahide Ohara, Okazaki; Akihiro Maeda, Kariya, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/439,954

(22) Filed: Nov. 12, 1999

(30) Foreign Application Priority Data

| Nov. 19, 1998 | (JP) | 10-329750 |
| Nov. 19, 1998 | (JP) | 10-329857 |
| Nov. 20, 1998 | (JP) | 10-330718 |

(51) Int. Cl.[7] .............................................. F28D 15/00
(52) U.S. Cl. .............................. 165/104.33; 165/104.21; 361/700; 257/715
(58) Field of Search ....................... 165/104.21, 104.31, 165/80.3; 361/700; 257/714–715

(56) References Cited

U.S. PATENT DOCUMENTS 5,998,863 A * 12/1999 Kobayashi et al. .... 165/104.33
6,076,596 A * 6/2000 Osakabe et al. ....... 165/104.33

* cited by examiner

Primary Examiner—Christopher Atkinson
(74) Attorney, Agent, or Firm—Harness, Dickey & Pierce, PLC

(57) ABSTRACT

A cooling device boiling and condensing refrigerant includes a refrigerant tank having a boiling space in which a part of liquid refrigerant is boiled and vaporized to gas refrigerant by absorbing heat from a heat-generating member, and a radiator having a header through which gas refrigerant from the boiling space flows into plural tubes connected to the header. One end of the header is inserted into the refrigerant tank, and the inserted end portion of the header has a communication port communicating with the boiling space through a gas refrigerant outlet. The communication port has a lower end at the same position as a lower end of the gas refrigerant outlet. Further, the tubes are inserted into the header to have opened ends within the header, and each lower end of the opened ends of the tubes is set at a position higher than the lower end of the communication port and the lower end of the gas refrigerant outlet. Thus, the cooling device prevents liquid refrigerant from flowing into the tubes from the opened ends in the header.

18 Claims, 15 Drawing Sheets

COOLING DEVICE BOILING AND CONDENSING REFRIGERANT

CROSS-REFERENCE TO RELATED APPLICATION

This application is related to and claims priority from Japanese Patent Applications No. Hei. 10-329750 filed on Nov. 19, 1998, No. Hei. 10-329857 filed on Nov. 19, 1998, and No. Hei. 10-330718 filed on Nov. 20, 1998, the contents of which are hereby incorporated by reference.

BACKGROUND OF THE INVENTION

1. Field of the Invention

The present invention relates to a cooling device for cooling a heat-generating member by boiling and condensing refrigerant.

2. Description of Related Art

A conventional cooling device has a refrigerant tank where refrigerant is boiled by heat from a heat-generating member, and a radiator where gas refrigerant from the refrigerant tank is condensed. In the cooling device, for cooling a heat-generating member such as a computer chip disposed in a printed bade plate, it is necessary for the heat-generating member to be attached onto an attachment surface of the refrigerant tank. In this case, a core portion of the radiator is disposed to be not protrude from the attachment surface of the refrigerant tank. Therefore, one side ends of the first and second headers of the radiator are inserted into the refrigerant tank from a surface opposite to the attachment surface to be not protrude from the attachment surface. However, in the cooling device, liquid refrigerant introduced into the first header together with gas refrigerant from the refrigerant tank may flows into radiator tubes from the first header, and radiating performance in the radiator is decreased. Further, when the radiator tubes are arranged in upper and lower two lines, liquid refrigerant condensed in the first header falls along an inner surface of the first header and may be introduced into the radiator tubes from opened ends of the radiator tubes opened in the first header. Therefore, refrigerant does not effectively circulate between the refrigerant tank and the radiator.

On the other hand, in the cooling device, when a duct enclosing the first and second headers of the radiator is disposed so that outside fluid is effectively blown toward a core portion of the radiator, the first and second headers may restrict the flow of the outside fluid, and the outside fluid may be not effectively blown toward the core portion of the radiator. Further, in this case, an unnecessary clearance may be formed between the first and second headers and the duct.

SUMMARY OF THE INVENTION

In view of the foregoing problems, it is an object of the present invention to provide a cooling device having a refrigerant tank and a radiator, which restricts liquid refrigerant from being introduced into tubes of the radiator.

It is an another object of the present invention, to provide a cooling device having a refrigerant tank and a radiator, in which outside fluid is effectively introduced into a core portion of the radiator.

According to the present invention, a cooling device includes a refrigerant tank having a boiling space between first and second wall surfaces, in which a part of liquid refrigerant is boiled and vaporized into gas refrigerant by absorbing heat from the heat-generating member attached onto the first wall surface, and a radiator for condensing refrigerant from the refrigerant tank. The radiator has a first header into which gas refrigerant from the boiling space of the refrigerant tank flows, a plurality of tubes in which gas refrigerant from the first header is cooled and condensed by performing heat exchange with outside fluid passing through the radiator, and a second header through which liquid refrigerant condensed in the tubes returns to the refrigerant tank. The second wall surface of the refrigerant tank has a first connection portion communicating with the boiling space at a gas refrigerant outlet of the refrigerant tank, and a second connection portion through which the second header communicates with the boiling space. In the cooling device, the first header is connected to the first connection portion to be approximately perpendicular to the second wall surface, the second header is connected to the second connection portion to be approximately perpendicular to the second wall surface, and the gas refrigerant outlet has a lower end disposed at a position lower than a lower end of the tubes opened into the first header. Thus, even when condensed liquid refrigerant stays in the first header, liquid refrigerant is prevented from flowing into the tubes, because liquid refrigerant flows into the boiling space through the gas refrigerant outlet when the a liquid refrigerant surface within the first header becomes higher than the lower end of the gas refrigerant outlet.

Preferably, the first header has an inserted end portion being inserted into the refrigerant tank from the first connection portion, the inserted end portion has a communication port through which the first header communicates with the boiling space, and the communication port has a lower end disposed at a position lower than the lower end of the tubes opened into the first header. Therefore, when a liquid refrigerant surface within the first header becomes higher than the lower end of the communication port, liquid refrigerant flows into the boiling space through the communication port and the gas refrigerant outlet. Thus, liquid refrigerant is prevented from flowing into the tubes.

Preferably, the tubes are arranged in upper and lower two lines between the first and second headers, and the first header has therein a partition wall for partitioning the tubes on the upper line and the tubes on the lower line within the first header. Therefore, even when condensed liquid refrigerant falls from an inner wall surface of the first header, the partition wall prevents the condensed liquid refrigerant from directly introduced into tubes on the lower line.

Further, the tubes have inserted end portions being inserted into the first header to protrude inside from an inner surface of the first header. Therefore, even when liquid refrigerant flows into the first header from the boiling space with the flow of gas refrigerant, gas refrigerant and liquid refrigerant can be separated by the inserted end portions of the tubes within the first header. Thus, gas refrigerant is introduced into the tubes, while liquid refrigerant is restricted from flowing into the tubes.

Preferably, the first header has a side wall surface contacting outside fluid in a flow direction of outside fluid, and the side wall surface is provided in such a manner that outside fluid contacting the side wall surface flows toward a core portion of the radiator. Therefore, outside fluid can be effectively introduced toward the core portion, and radiating performance of the radiator can be improved.

BRIEF DESCRIPTION OF THE DRAWINGS

Additional objects and advantages of the present invention will be more readily apparent from the following detailed description of preferred embodiments when taken together with the accompanying drawings, in which.

DETAILED DESCRIPTION OF THE PRESENTLY PREFERRED EMBODIMENTS

Preferred embodiments of the present invention will be described hereinafter with reference to the accompanying drawings.

Figure 1:
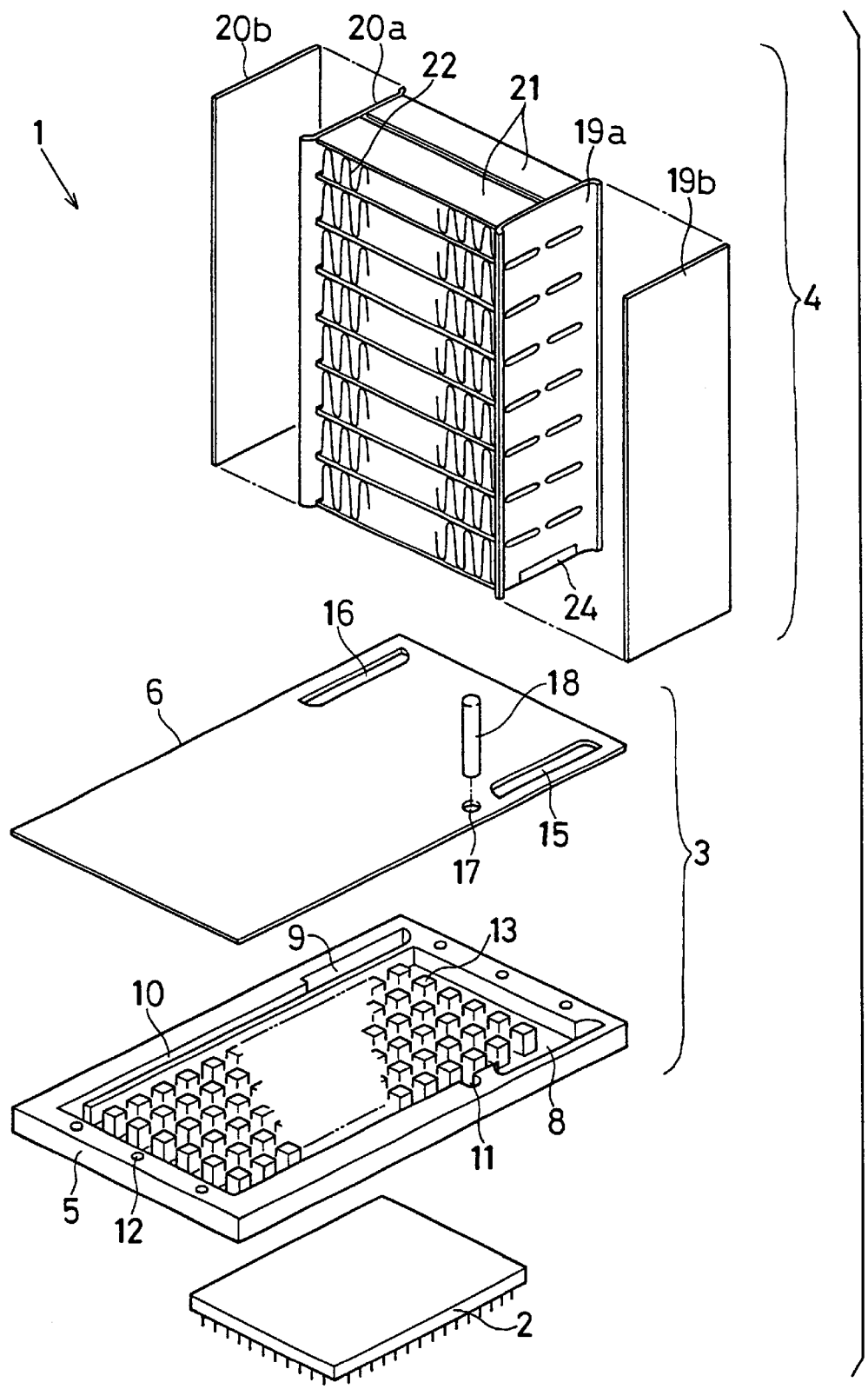
FIG. 1 is a disassemble perspective view showing a cooling device according to a first preferred embodiment of the present invention.

A first preferred embodiment of the present invention will be now described with reference to FIGS. 1–9. In the present invention, a cooling device 1 is typically used for cooling a heat-generating member 2 such as a computer chip disposed in a printed base plate. As shown in FIG. 1, the cooling device 1 includes a refrigerant tank 3 in which liquid refrigerant (e.g., water, alcohol or flon) is stored, and a radiator 4 in which gas refrigerant boiled in the refrigerant tank 3 by heat generated from the heat-generating member 2 is heat-exchanged with outside fluid (e.g., cool air) to be liquefied. The refrigerant tank 3 and the radiator 4 are integrally bonded through brazing.

Figure 2:
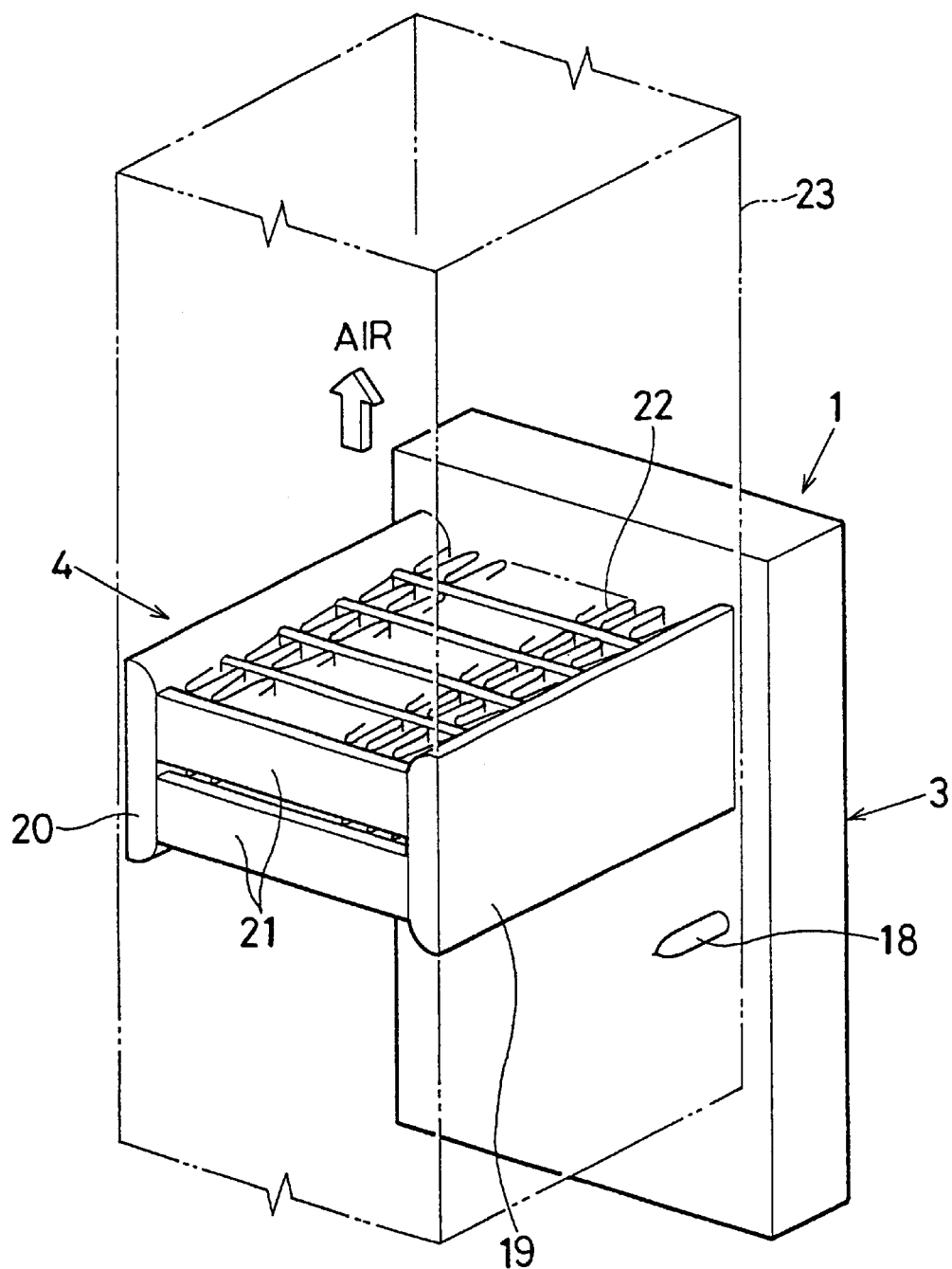
FIG. 2 is a perspective view showing the cooling device according to the first embodiment.
Figure 3:
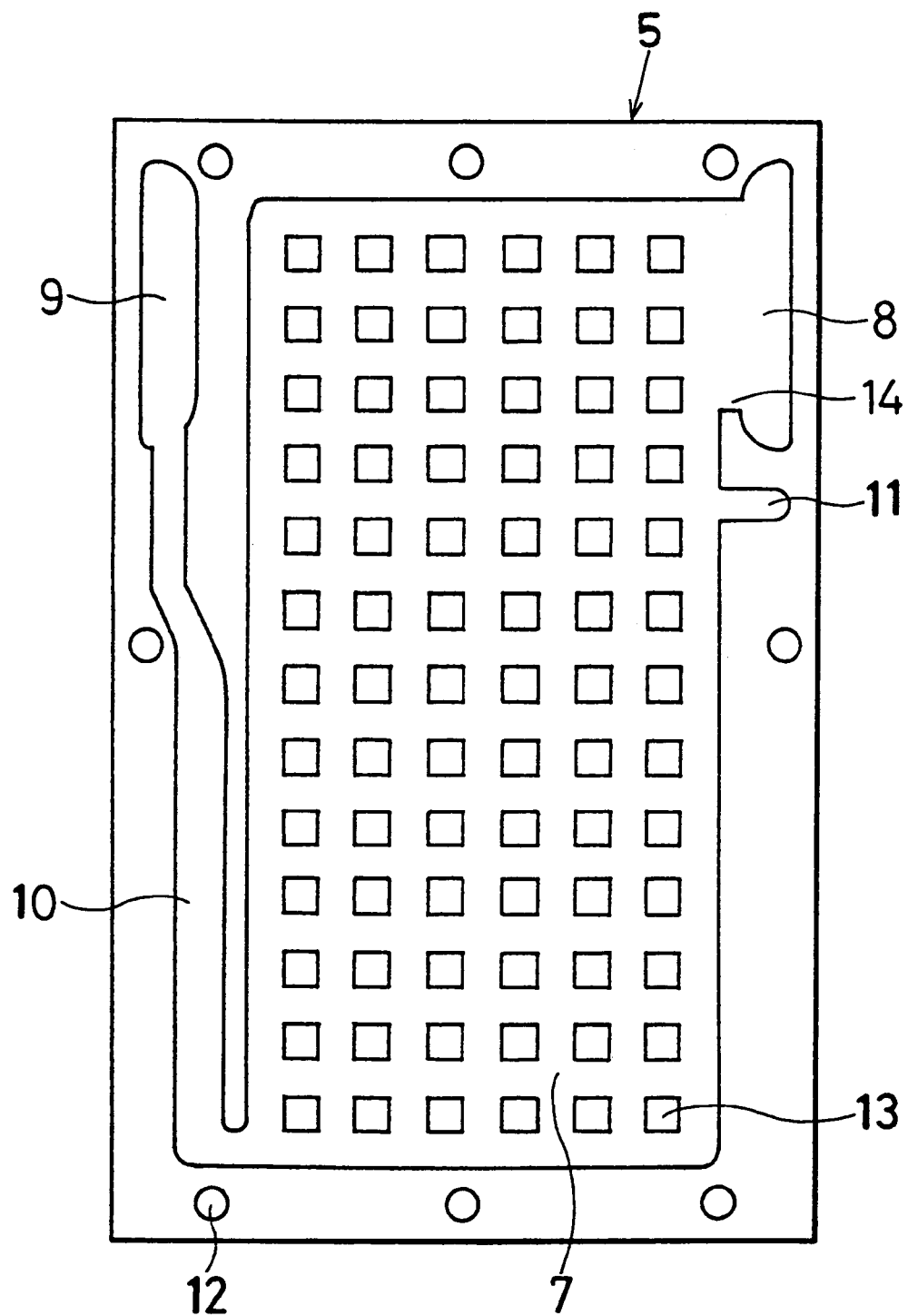
FIG. 3 is a plan view of a thin receiver of a refrigerant tank according to the first embodiment.

The refrigerant tank 3 includes a thin receiver 5 and a cover plate 6 made of metal such as aluminum having a sufficient heat-transmitting performance, and is used in a vertical state as shown in FIG. 2. As shown in FIG. 3, the thin receiver 5 is formed into a rectangular flat shape having a larger vertical dimension. The thin receiver 5 has a flat surface on a back side in FIG. 3, to which the heat-generating member 2 is attached. On a face side of the thin receiver in FIG. 3, a boiling space 7, a pair of header connection portions 8, 9, a liquid-refrigerant returning passage 10 and refrigerant inlet portion 11 are provided. Further, as shown in FIG. 3, plural holes 12 penetrating through the thin receiver 5 are formed in an outer peripheral part of the thin receiver 5.

The boiling space 7 is provided within an inside portion of the thin receiver 5, so that liquid refrigerant is boiled by heat from the heat-generating member 2. Plural prismatic portions 13 are arranged in the boiling space 7 to have a predetermined distance between adjacent prismatic portions 13. Therefore, a refrigerant passage is defined in the boiling space 7 by the plural prismatic portions 13. The plural prismatic portions 13 disposed in the boiling space 7 are also used for enhancing the strength of the refrigerant tank 3.

The header connection portions 8, 9 are connected to first and second headers 19, 20 of the radiator 4. Therefore, the header connection portions 8, 9 have spaces corresponding to sectional shapes of the first and second headers 19, 20, respectively. Specifically, the header connection portion 8 is provided adjacent to the boiling space 7 at an upper right side in FIG. 3 to communicate with the boiling space 7 through a gas refrigerant outlet 14. On the other hand, the header connection portion 9 is provided at an upper left side of the boiling space 7 in FIG. 3 to communicate with the boiling space 7 through the liquid-refrigerant returning passage 10.

The liquid-refrigerant returning passage 10 for returning condensed liquid refrigerant liquefied in the radiator 4 to the boiling space 7 is provided to extend from a lower part of the header connection portion 9 downwardly until a bottom position of the boiling space 7.

The refrigerant inlet portion 11 for pouring refrigerant into the boiling space 7 of the refrigerant tank 3 is provided in the refrigerant tank 3 on a lower side of the header connection portion 8, for example. The boiling space 7, the header connection portions 8, 9, the liquid-refrigerant returning passage 10 and the refrigerant inlet portion 11 are formed in the refrigerant tank 3 by cutting, electrical discharging machining, forging and casting, for example. The holes 12 are provided for fixing the heat-generating member 2 onto the flat surface of the thin receiver 5 by a fastening member.

The cover plate 6 of the refrigerant tank 3 is connected to an opened surface of the thin receiver 5, opposite to the flat surface, so that the boiling space 7 and the liquid-refrigerant returning passage 10 are air-tightly sealed within the refrigerant tank 3. Insertion ports 15, 16 from which the first and second headers 19, 20 of the radiator 4 are inserted into the header connection portions 8, 9 are opened in the cover plate 6 at both sides corresponding to the header connection portions 8, 9. Therefore, the insertion ports 15, 16 respectively communicate with the header connection portions 8, 9. Further, the cover plate 6 has a round hole 17 communicating with the refrigerant inlet portion 11 provided in the thin receiver 5. The round hole 17 is connected to an inlet pipe 18 through which refrigerant is poured and introduced into the refrigerant tank 3. The round hole 17 is provided around an extending line of the header connection portion 8 in a vertical direction in FIG. 2. After refrigerant is poured into the refrigerant tank 3 by a predetermined amount, a top end of the inlet pipe 18 is closed. The cover plate 6 can be formed by a clad material on which a brazing material is applied.

The radiator 4 includes the first header 19 on a gas refrigerant side, the second header 20 on a liquid refrigerant side, and a core portion between the first and second headers 19, 20. As shown in FIG. 2, cool air is blown toward the radiator 4 through a duct 23. The duct 23 is disposed to enclose the first and second headers 19, 20 of the radiator 4. Further, the duct 23 is disposed along outer wall surfaces of the first and second headers 19, 20 to have a little clearance between the outer wall surfaces 19, 20 (i.e., first and second outer header plates 19b, 20b) and the duct 23 or to contact the outer wall surfaces of the first and second headers 19, 20. As shown in FIG. 2, cool air (outside fluid) passes through the core portion of the radiator 4 upwardly from below.

Gas refrigerant boiled by heat from the heat-generating member 2 in the refrigerant tank 3 flows into the first header 19, and passes through the core portion to be liquefied. Liquid refrigerant condensed in the core portion of the radiator 4 flows into the second header 20, and is introduced into the refrigerant tank 3 through the liquid-refrigerant returning passage 10. As shown in FIG. 1, the first header 19 is formed by a first inner header plate 19a on a side of the core portion and a first outer header plate 19b on an outer wall side. Similarly, the second header 20 is formed by a second inner header plate 20a on a side of the core portion and a second outer header plate 20b on an outer wall side.

Figure 5:
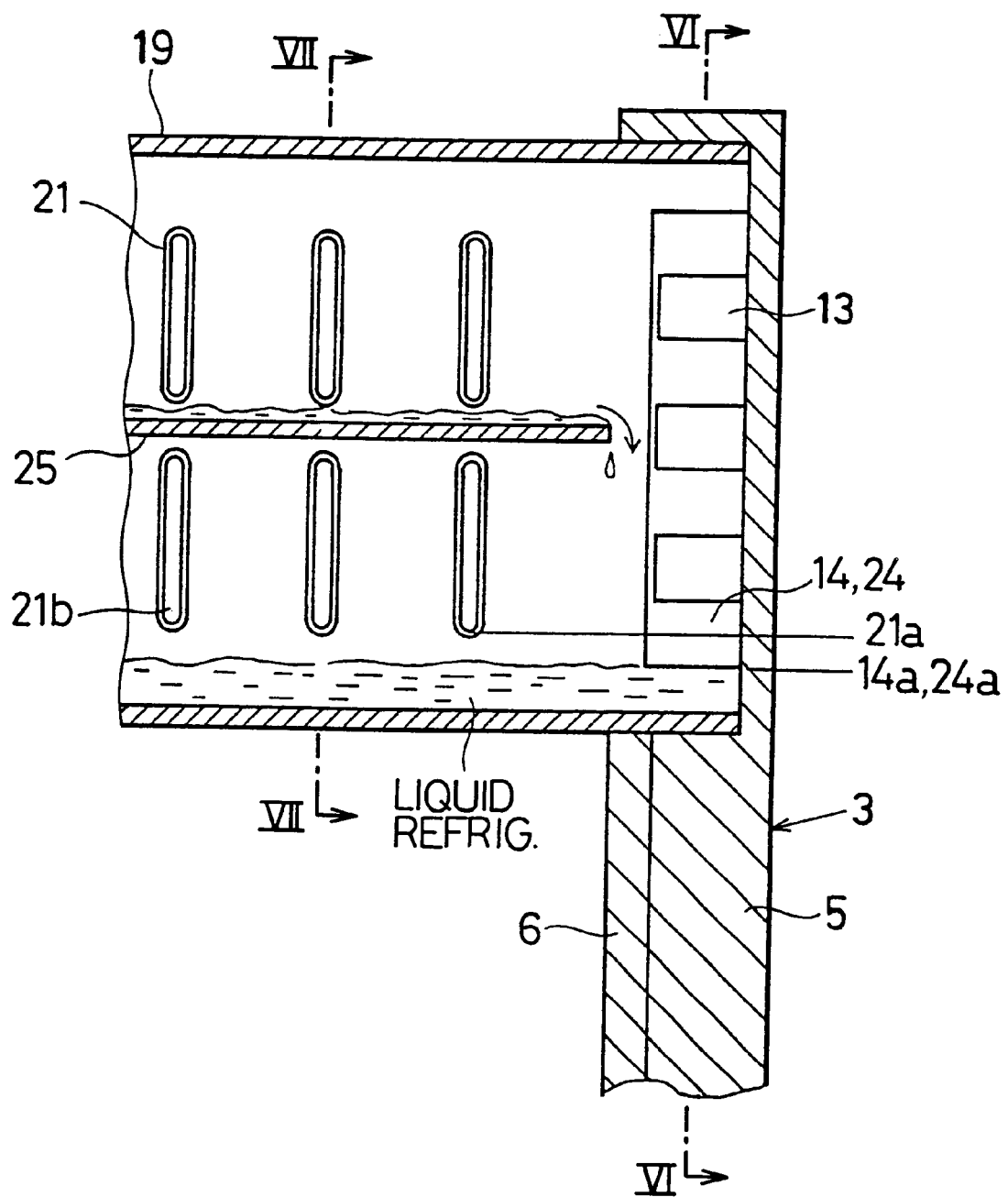
FIG. 5 is a cross-sectional view taken along line V—V in FIG. 4, showing a connection portion between the refrigerant tank and a first header of the radiator.
Figure 7:
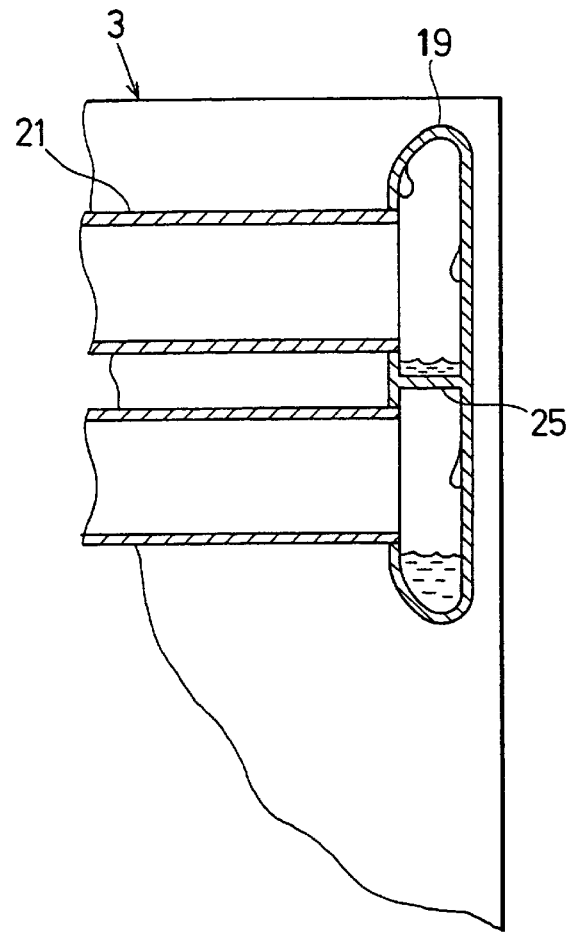
FIG. 7 is a cross sectional view taken along line VII—VII in FIG. 5.

One side end of the first header 19 in a longitudinal direction of the first header 19 is inserted into the insertion port 15 of the cover plate 6 and is further inserted into the header connection portion 8 within the thin receiver 5. The first header 19 of the radiator 4 is connected to the refrigerant tank 3 to be approximately perpendicular to the cover plate 6. As shown in FIGS. 1, 5, a communication port 24 communicating with the gas refrigerant outlet 14 of the refrigerant tank 3 is formed in the first inner header plate 19a of the first header 19 at the inserted part. In the first embodiment, the communication port 24 has a size similar to the gas refrigerant outlet 14, and a shape corresponding to the gas refrigerant outlet 14. Further, in the first inner header plate 19a of the first header 19, plural tube insertion elongated holes into which one side ends of radiator tubes 21 are inserted are formed to be arranged in upper and lower two lines to have a predetermined distance between adjacent elongated holes in each line. Further, as shown in FIGS. 5, 7, a partition wall 25 for partitioning an inner space of the first header 19 into upper and lower spaces is disposed within the first header 19. The partition wall 25 extends over an approximate entire longitudinal dimension of the first header 19 at a position of the first inner header plate 19a between the upper and lower two lines of the tube insertion elongated holes to partition the upper and lower two lines of the tube insertion elongated holes. However, as shown in FIG. 5, the partition wall 25 is not provided at a position where the communication port 24 is provided.

On the other hand, one top end of the second header 20 in the longitudinal direction is inserted into the header connection portion 9 of the thin receiver 5 through the insertion port 16 of the cover plate 6. The second header 20 of the radiator 4 is connected to the refrigerant tank 3 approximately perpendicular to the cover plate 6. Further, the second header 20 is disposed in parallel with the first header 19. The second header 20 has a communication port communicating with the liquid-refrigerant returning passage 10 on the inserted end side. In the second inner header plate 20a of the second header 20, plural tube insertion elongated holes in which other side ends of the radiator tubes 21 are inserted are formed to be arranged in two lines to have a predetermined distance between adjacent elongated holes in each line.

The core portion is a heat-radiating portion in which heat of gas refrigerant boiled by heat from the heat-generating member 2 is transmitted to the cool air. The core portion includes the plural radiator tubes 21 and plural radiator fins 22 each of which is disposed between adjacent radiator tunes 21. Each radiator tube 21 is formed into a flat like in a laminating direction of the radiator tubes 21 and the radiator fins 22. The radiator tubes 21 are arranged in upper and lower two lines between the first header 19 and the second header 20. The radiator tubes 21 in each line are laminated and connected through the radiator fins 22. One side ends of the radiator tubes 21 are inserted into the elongated holes which are provided in the first inner header plate 19a of the first header 19 in two lines. The other side ends of the radiator tubes 21 are inserted into the elongated holes which are provided in the second inner header plate 20a of the second header 20 in two lines. Thus, the first header 19 and the second header 20 communicate with each other through the radiator tubes 21. Each radiator fin 22 is formed by bending a thin metal plate having a sufficient heat transmitting performance, such as an aluminum plate, into a wave shape. Each radiator fin 22 is connected to outer wall surfaces of the radiator tubes 21 adjacent to each other.

Figure 4:
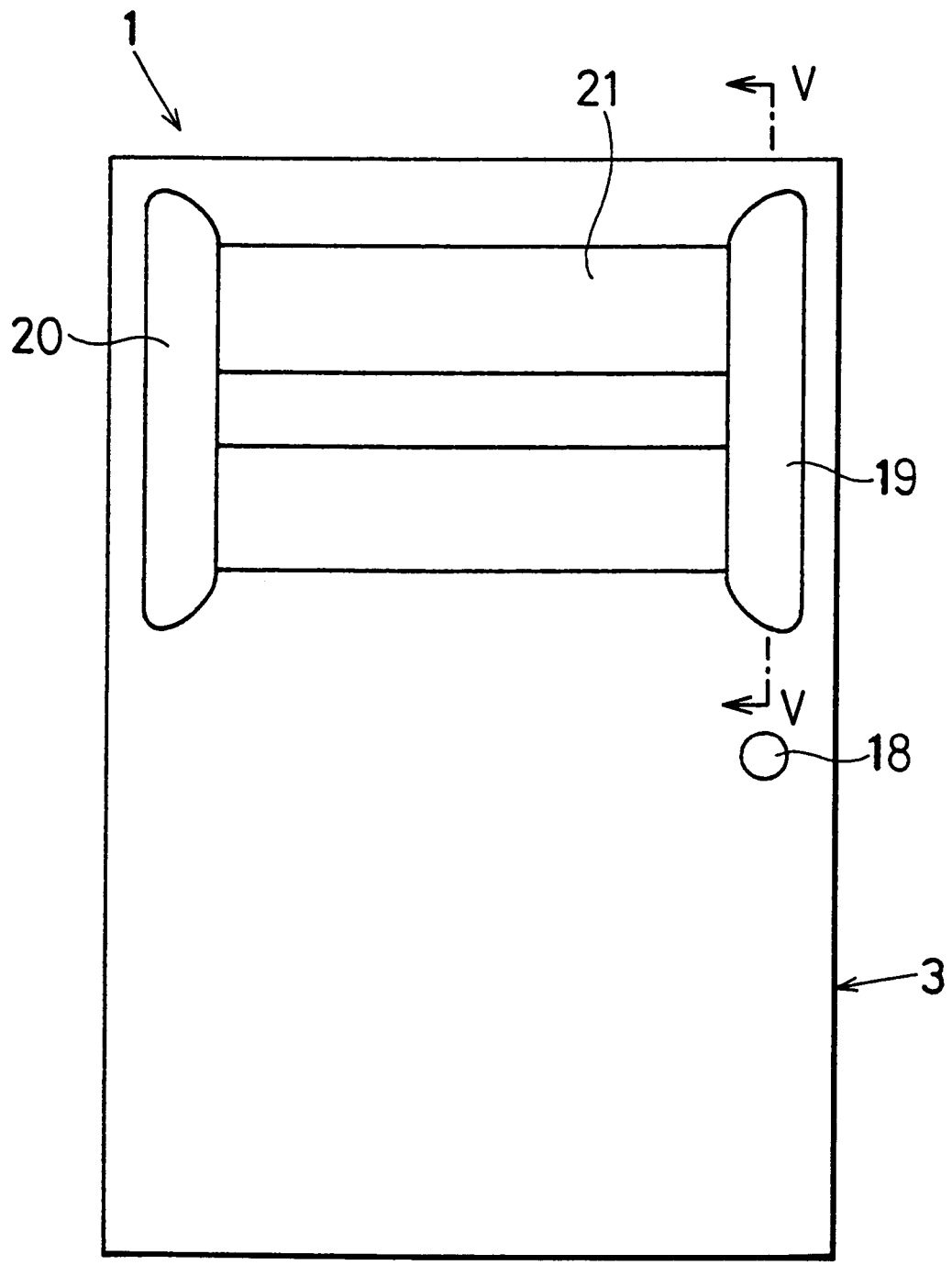
FIG. 4 is a front view showing the cooling device according to the first embodiment.
Figure 6:
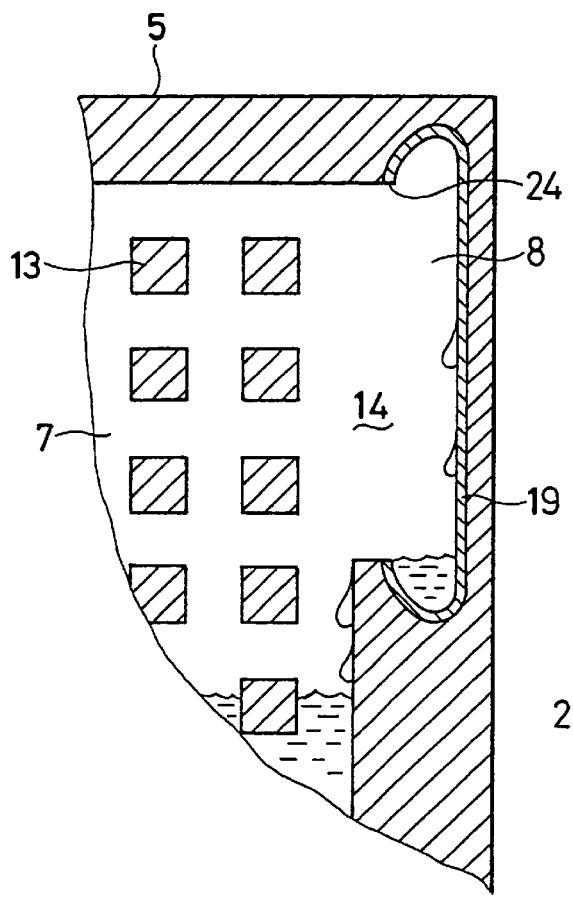
FIG. 6 is a cross sectional view taken along line VI—VI in FIG. 5.

FIG. 5 is a cross-sectional view taken long line V—V in FIG. 4, FIG. 6 is a cross-sectional view taken along line VI—VI in FIG. 5, and FIG. 7 is a cross-sectional view taken along line VII—VII in FIG. 5. Here, the position relationship between a lower end 14a of the gas refrigerant outlet 14, a lower end 24a of the communication port 24 opened in the first inner header plate 19a of the first header 19, and a lower end 21a of the radiator tubes 21 inserted into the elongated holes on the lower line will be described. As shown in FIGS. 5, 6, the lower end 14a of the gas refrigerant outlet 14 is positioned on the same height position as the lower end 24a of the communication port 24. Further, the lower end 21a of the openings 21b of the radiator tubes 21 on the lower line is set at a position higher than the lower end 24a of the communication port 24 and the lower end 14a of the gas refrigerant outlet 14. That is, the lower end 14a of the gas refrigerant outlet 14 and the lower end 24a of the communication port 24 are set at a position lower than the lower end 21a of the openings 21b of the radiator tubes 21 on the lower line.

Next, operation of the cooling device 1 according to the first embodiment will be described.

Figure 8:
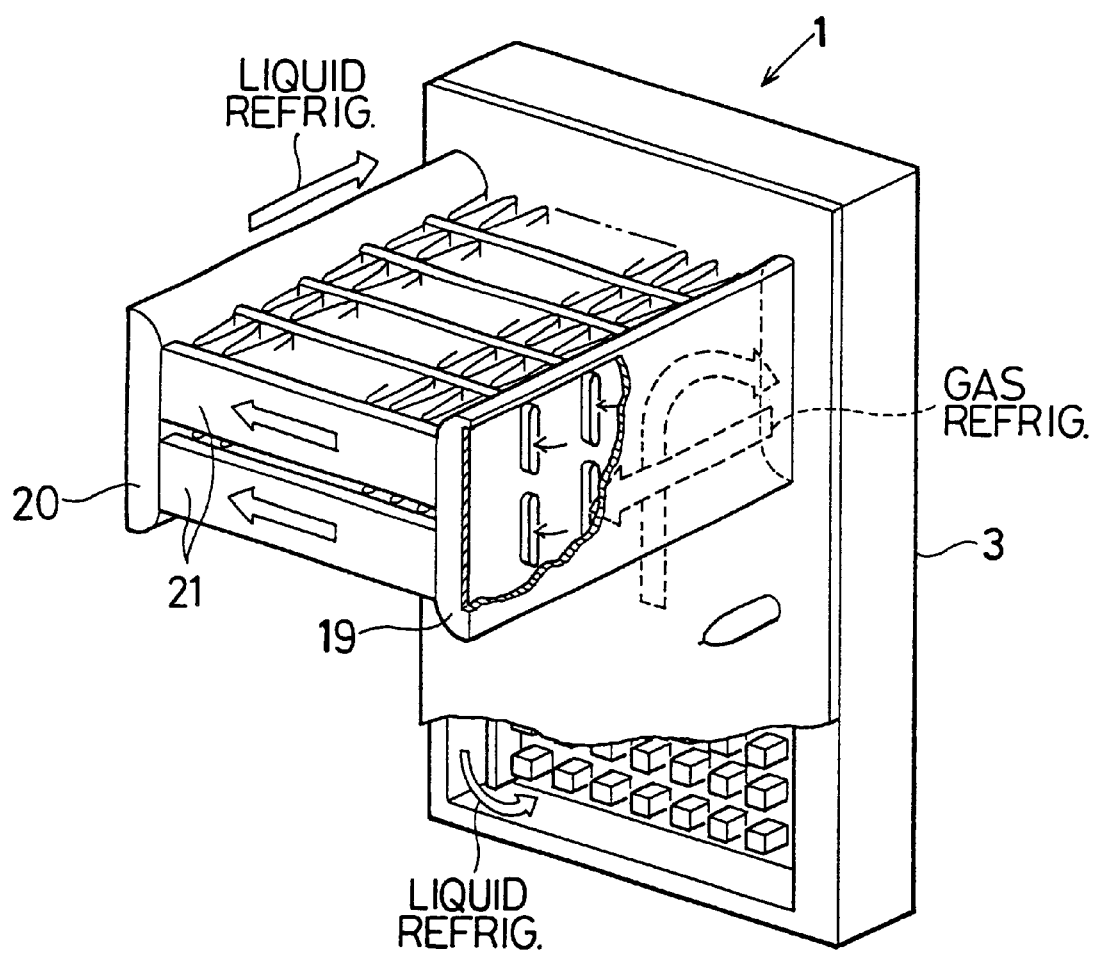
FIG. 8 is a perspective view of the cooling device, for explaining a refrigerant flow within the cooling device, according to the first embodiment.

A part of liquid refrigerant in the refrigerant tank 3 is boiled and evaporated by heat from the heat-generating member 2 in the boiling space 7, and the boiled refrigerant vapor (i.e., gas refrigerant) flows into the first header 19 from the boiling space 7 through the gas refrigerant outlet 14. Thereafter, gas refrigerant flows into each radiator tubes 21 from the first header 19. Gas refrigerant flowing through the radiator tubes 21 is cooled and condensed by cool air blown toward the core portion of the radiator 4 through the duct 23. Condensed liquid refrigerant flows into the second header 20 by gas refrigerant pressure, falls into the liquid-refrigerant returning passage 10 from the second header 20, and is returned into the boiling space 7 within the refrigerant tank 3. The flow direction of refrigerant in the cooling device 1 is indicated in FIG. 8 by arrows.

When gas refrigerant flowing into the first header 19 is condensed within the first header tank 19, the condensed liquid refrigerant falls and flows along an inner wall surface of the first header 19, and stays in the bottom of the first header 19. Here, when the condensed liquid surface within the first header 19 becomes higher than the lower end 14a of the gas refrigerant outlet 14 and the lower end 24a of the communication port 24, liquid refrigerant within the first header 19 returns into the boiling space 7 of the refrigerant tank 3 through the communication port 24 and the gas refrigerant outlet 14.

According to the first embodiment of the present invention, the lower end 14a of the gas refrigerant outlet 14 and the lower end 24a of the communication port 24 are provided at positions lower than the lower end 21a of the openings 21b of the radiator tubes 21. Therefore, even when condensed liquid refrigerant stays in the inner space within the first header 19, the condensed water staying in the first header 19 is not introduced into the radiator tubes 21 from the openings 21b. Thus, it can prevent liquid refrigerant from flowing into the radiator tubes 21, so that radiating performance of gas refrigerant in the radiator 4 is improved.

Further, as shown in FIG. 7, because the inner space of the first header 19 is partitioned by the partition wall 25, condensed liquid refrigerant falling along the inner wall surface of the first header 19 is prevented from falling to the openings 21b of the radiator tubes 21 on the lower line. As shown in FIG. 5, liquid refrigerant condensed on the upper side of the partition wall 25 within the first header 19 flows on an upper surface of the partition wall 25, and falls downwardly from an end of the partition wall 25.

In the cooling device 1 according to the first embodiment of the present invention, the first and second headers 19, 20 are connected to the refrigerant tank 3 approximately perpendicularly, and the core portion of the radiator 4 is disposed between the first and second headers 19, 20. Therefore, as shown in FIG. 4, the radiator 4 can be accommodated within an outer size range of the refrigerant tank 3 without protruding from the flat surface of the refrigerant tank 3, where the heat-generating member 3 is attached. Thus, the present invention can be applied for cooling the heat-generating member 2 such as a computer chip disposed in a print base plate.

Figure 9:
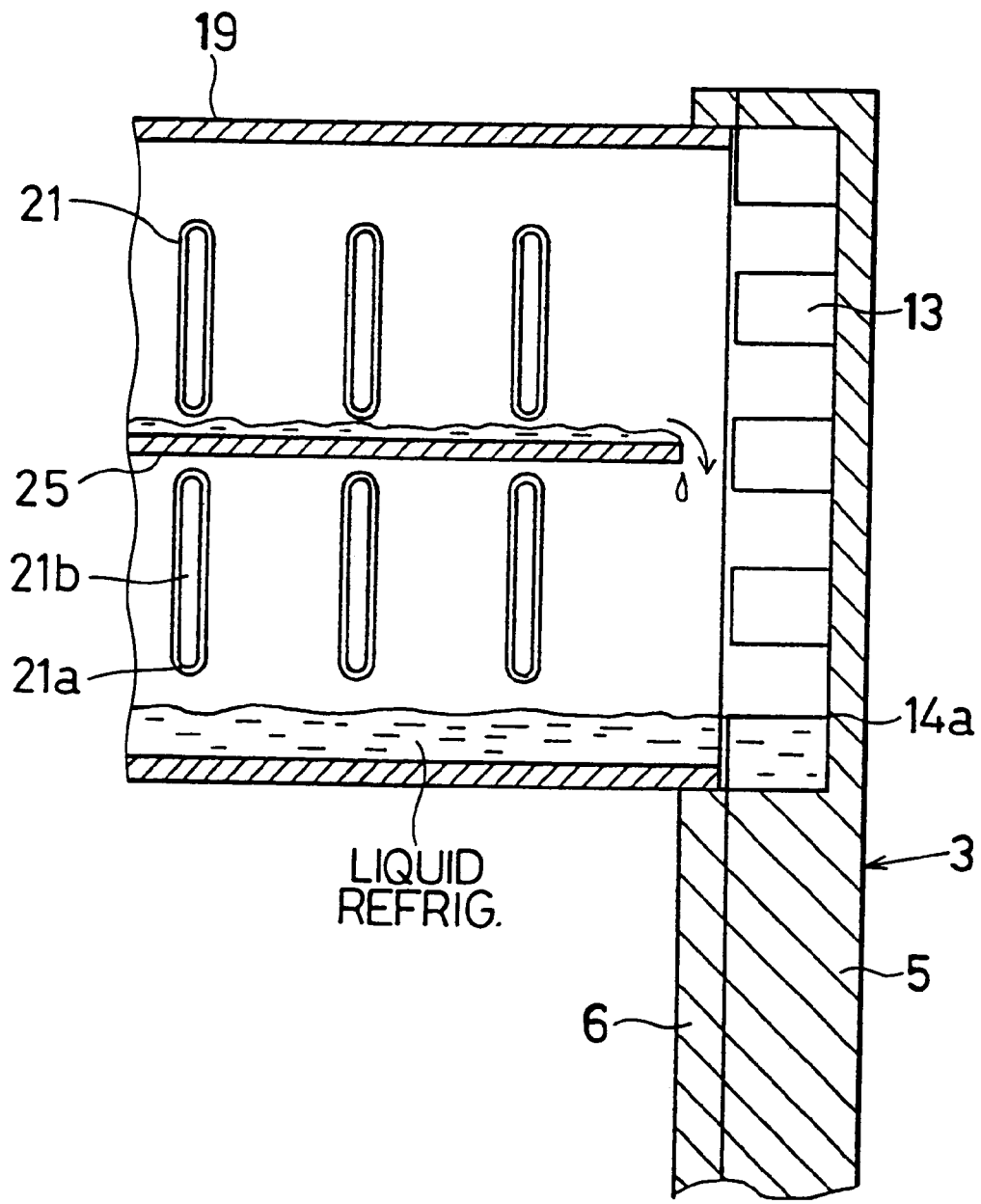
FIG. 9 is a cross-sectional view showing a connection portion between the first header of the radiator and the refrigerant tank, according to a modification of the first embodiment.

In the above-described first embodiment of the present invention, because the end of the first header 19 is inserted into the refrigerant tank 3 until the header connection portion 8 through the insertion port 15 of the cover plate 6, the communication port 24 is formed at the inserted end of the first header 19. However, as shown in FIG. 9, the end of the first header 19 may be inserted into only the insertion port 15 of the cover plate 6 to be connected to the refrigerant tank 3. In this case, it is not necessary to provide the communication port 24 on the end of the first header 19. Therefore, only the lower end 14a of the gas refrigerant outlet 14 is set at a position lower than the lower end 21a of the openings 21b of the radiator tubes 21 on the lower line.

In the above-described first embodiment of the present invention, the lower end 14a of the gas refrigerant outlet 14 is set at the same height position as the lower end 24a of the communication port 24. However, the lower end 14a of the gas refrigerant outlet 14 may be set at a height position different from that of the lower end 24a of the communication port 24. Even in this case, the lower end 14a of the gas refrigerant outlet 14 and the lower end 24a of the communication port 24 are set at positions lower than the lower end 21a of the openings 21b of the radiator tubes 21 on the lower line, so that the effect similar to that of the first embodiment can be obtained.

In the above-described first embodiment of the present invention, the plural radiator tubes 21 are arranged in upper and lower two lines. However, the radiator tubes 21 may be arranged in plural lines more than two lines, or may be arranged in a single straight line. When the radiator tubes 21 are arranged in plural lines more than two lines, it is necessary to provide the partition wall 25 between adjacent lines within the first header 19. Further, when the radiator tubes 21 are arranged in a single straight line, the partition wall 25 is not necessary.

Figure 10:
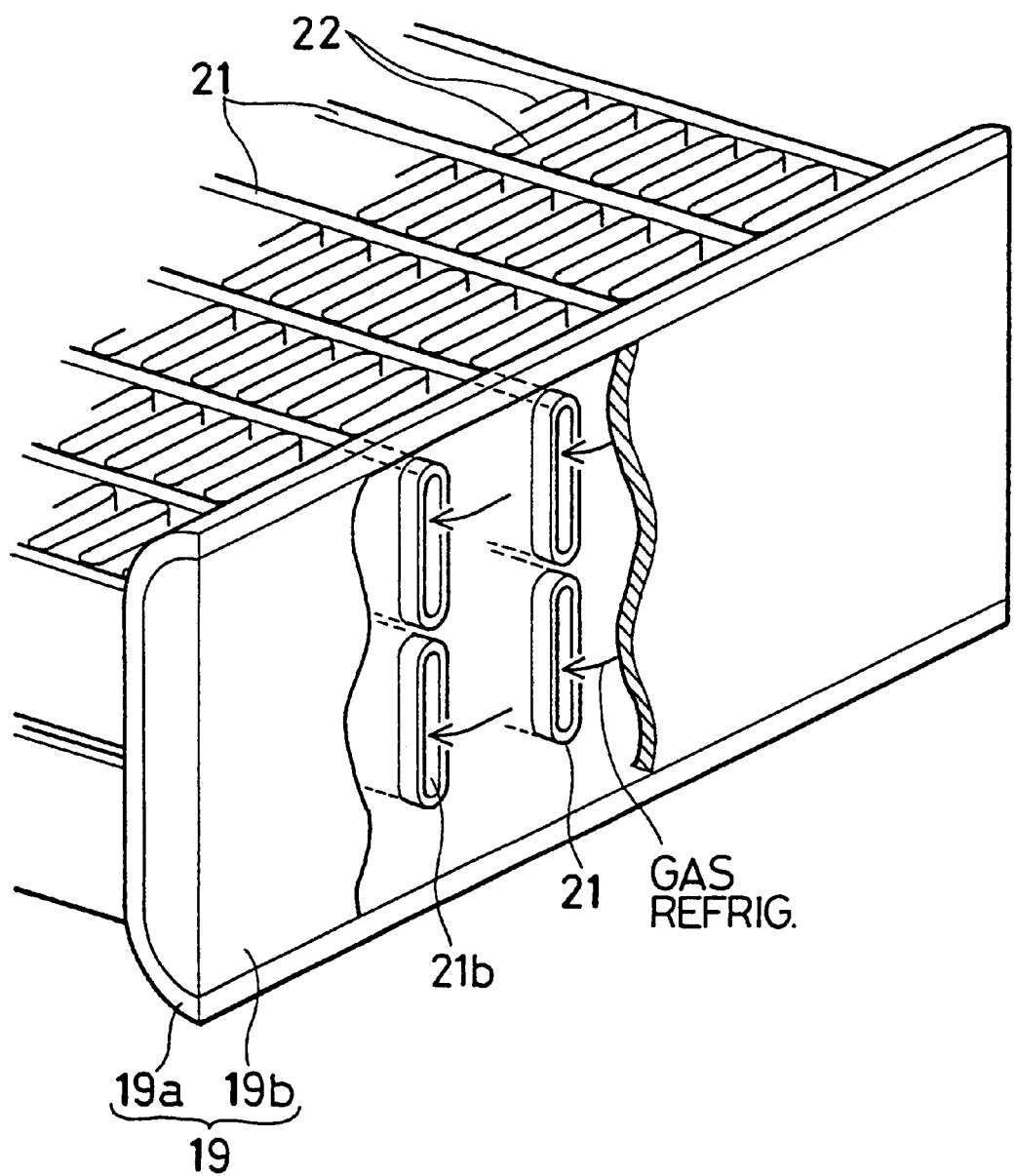
FIG. 10 is a perspective view showing a gas-liquid separation structure within the first header of the radiator according to a second preferred embodiment of the present invention.

A second preferred embodiment of the present invention will be described with reference to FIG. 10. In the second embodiment, each end of the radiator tubes 21 has the opening 21b, and is inserted into the inner space of the first header 19 to protrude inside from the inner wall surface of the first inner header plate 19a. Similarly to the first header 19, each the other side end of the radiator tubes 21 may protrude from the second inner header plate 20a into the inner space of the second header 20.

According to the second embodiment of the present invention, one side ends of the radiator tubes 21 are inserted into the elongated holes provided in the first inner header plate 19a to be arranged in the two lines, to protrude from the first inner header plate 19a into the inner space of the first header 19. That is, a gas-liquid separation structure is formed within the first header 19 by the protrusion ends of the radiator tubes 21. Thus, even when liquid refrigerant is entered into the inner space of the first header 19 with gas refrigerant flow from the boiling space 7 of the refrigerant tank 3, liquid refrigerant is separated from gas refrigerant within the first header 19 by the protrusion ends of the radiator tubes 21 to be prevented from flowing into the radiator tubes 21. As a result, approximately only gas refrigerant can be introduced into the radiator tubes 21, and refrigerant can be stably circulates between the refrigerant tank 3 and the radiator 4.

Figure 11:
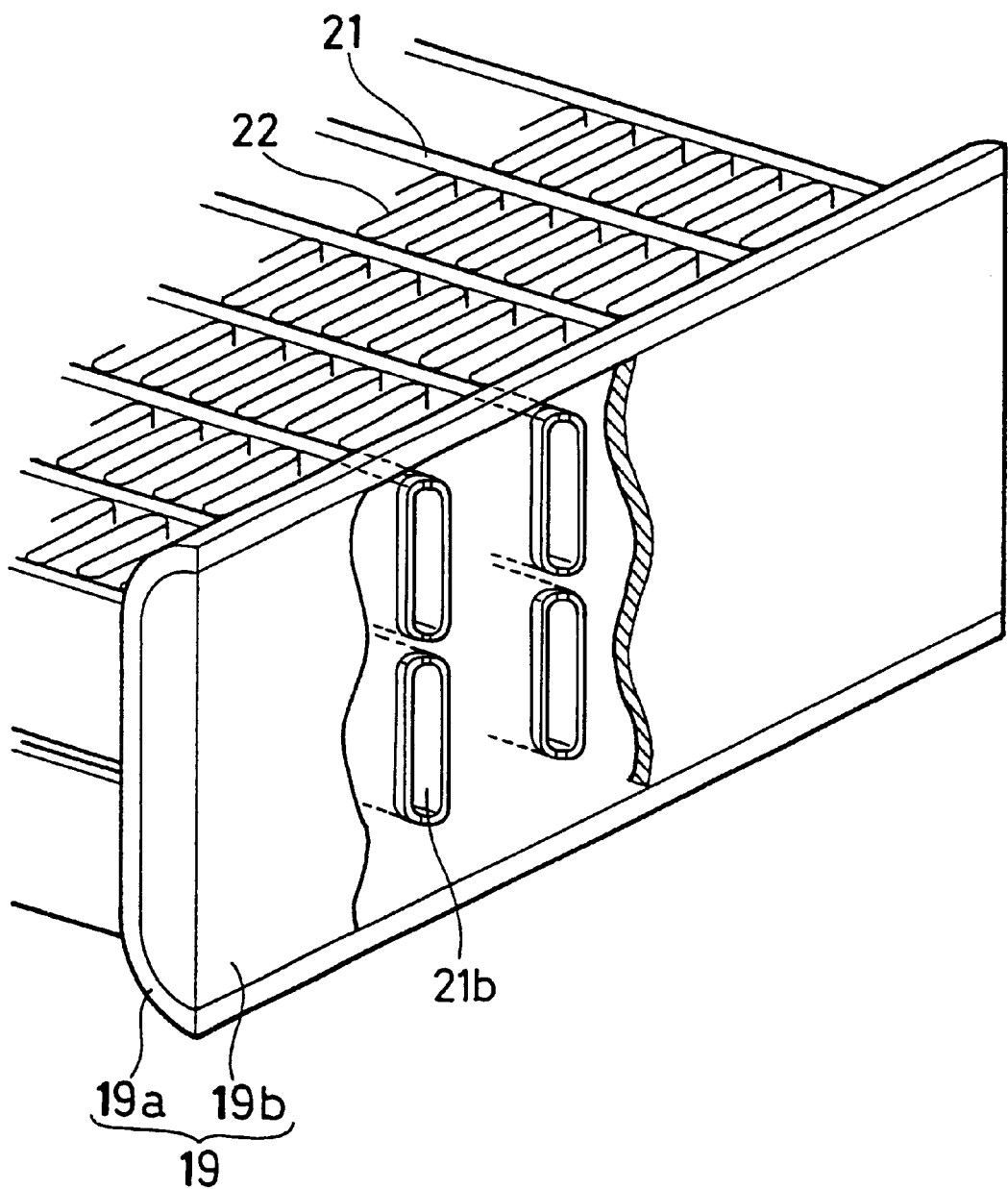
FIG. 11 is a perspective view showing a gas-liquid separation structure within the first header of the radiator according to a third preferred embodiment of the present invention.

A third preferred embodiment of the present invention will be described with reference to FIG. 11. In the third embodiment, the openings 21b of the ends of the radiator tubes 21 are opened toward a downstream side in a flow direction of gas refrigerant flowing through the first header 19. Further, similarly to the second embodiment, the gas-liquid separation structure is provided. Thus, even when liquid refrigerant is entered into the inner space of the first header 19 with gas refrigerant flow from the boiling space 7 of the refrigerant tank 3, liquid refrigerant is separated from gas refrigerant within the first header 19 by the protrusion ends of the radiator tubes 21 to be prevented from being introduced into the radiator tubes 21. Further, because the openings 21b of the ends of the radiator tubes 21 are opened toward the downstream side in the flow direction of gas refrigerant in the first radiator 19, it can further prevent liquid refrigerant from being directly introduced into the openings 21b of the radiator tubes 21.

In the third embodiment, the ends of the radiator tubes 21 on a most upstream side in the flow direction of the gas refrigerant within the first header 19 may be closed, so that gas refrigerant is introduced into the radiator tubes 21 on a downstream side in the flow direction of gas refrigerant within the first header 19. In this case, gas-liquid separation effect in the first header 19 can be further improved.

Figure 12A:
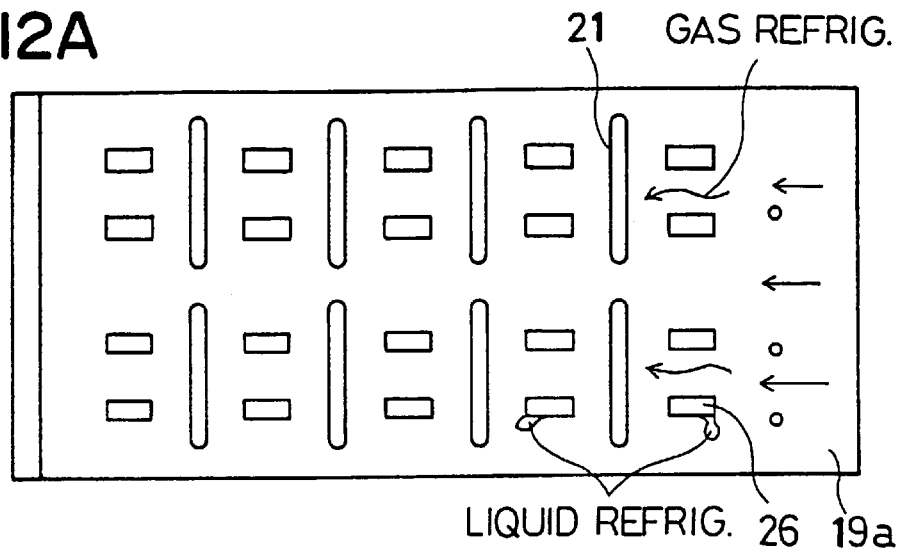
FIGS. 12A, 12B, 12C are plan views each showing a gas-liquid separation structure within the first header of the radiator according to a fourth preferred embodiment of the present invention.
Figure 12B:
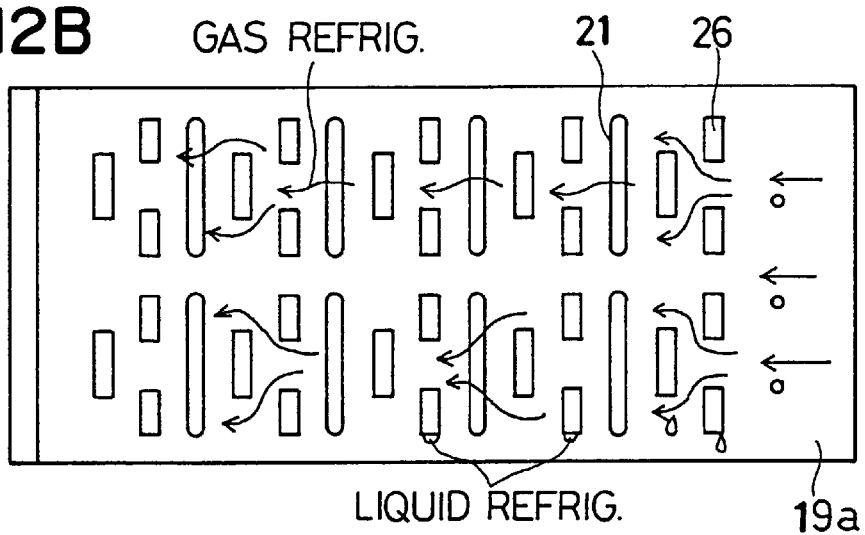
Figure 12C:
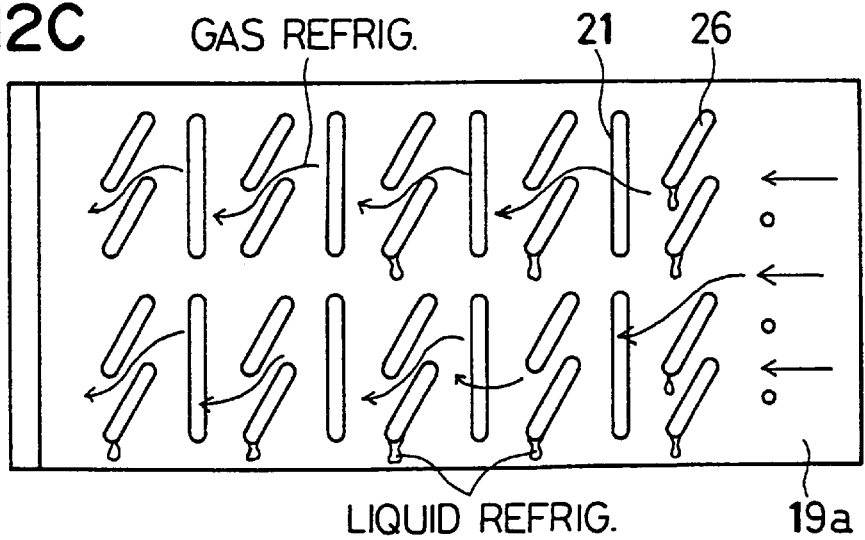

A fourth preferred embodiment of the present invention will be described with reference to FIGS. 12A, 12B, 12C. FIGS. 12A, 12B, 12C are plan views each showing a gas-liquid separation structure within the first header 19. In the fourth embodiment, plural protrusions 26 protruding inside from the first inner header plate 19a or the first outer header plate 19b are provided. For example, in FIG. 12A, the protrusions 26 are arranged in plural lines. In FIG. 12B, the protrusions 26 are arranged in a zigzag shape. Further, in FIG. 12C, the protrusions 26 are arranged in slant relative to the radiator tubes 21. In this case, liquid refrigerant introduced into the first header 19 together with gas refrigerant flowing through the first header 19 contacts the protrusions 26 so that liquid refrigerant is separated from gas refrigerant.

Figure 13A:
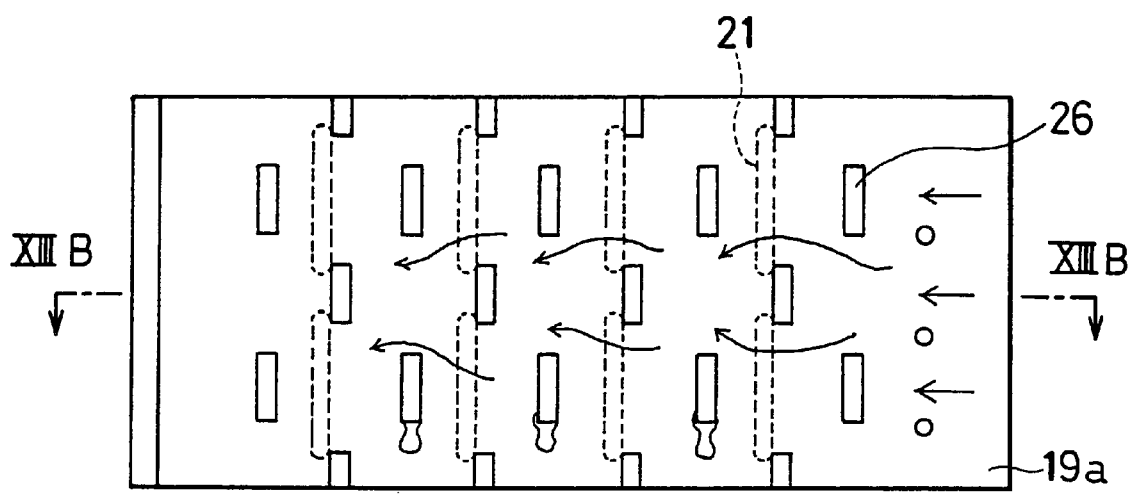
FIG. 13A is a plan view showing a gas-liquid separation structure within the first header of the radiator according to a fifth preferred embodiment of the present invention.
Figure 13B:
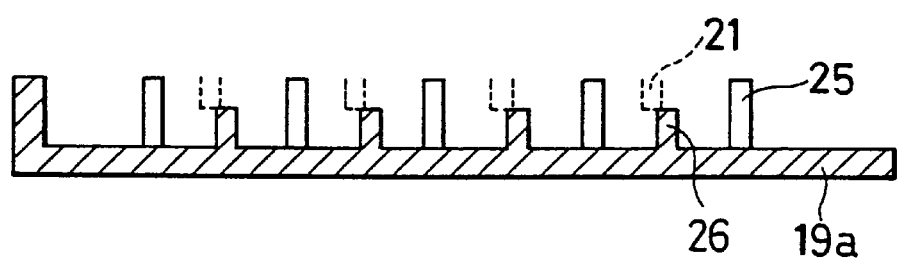
FIG. 13B is cross-sectional view taken along line XIIIB—XIIIB in FIG. 13A.

A fifth preferred embodiment of the present invention will be described with reference to FIGS. 13A, 13B. FIG. 13A is a plan view showing a gas-liquid separation structure of the fifth embodiment. FIG. 13B is a cross-sectional view taken along line XIIIB—XIIIB in FIG. 13A. As shown in FIGS. 13A, 13B, a part of the protrusions 26 are disposed to contact the radiator tubes 21 at an upstream side in the flow direction of gas refrigerant within the first header 19. The other portions are similar to those in the fourth embodiment. Thus, liquid refrigerant introduced into the first header together with gas refrigerant is sufficiently separated from gas refrigerant by contacting the protrusions 26.

In the above-described fourth and fifth embodiments, the protrusions 26 are provided within an entire inner space of the first header 19. However, the protrusions 26 may be provided only at a position proximate to the header connection portion 8, where liquid refrigerant is readily discharged from the refrigerant tank 3 together with gas refrigerant.

Figure 14:
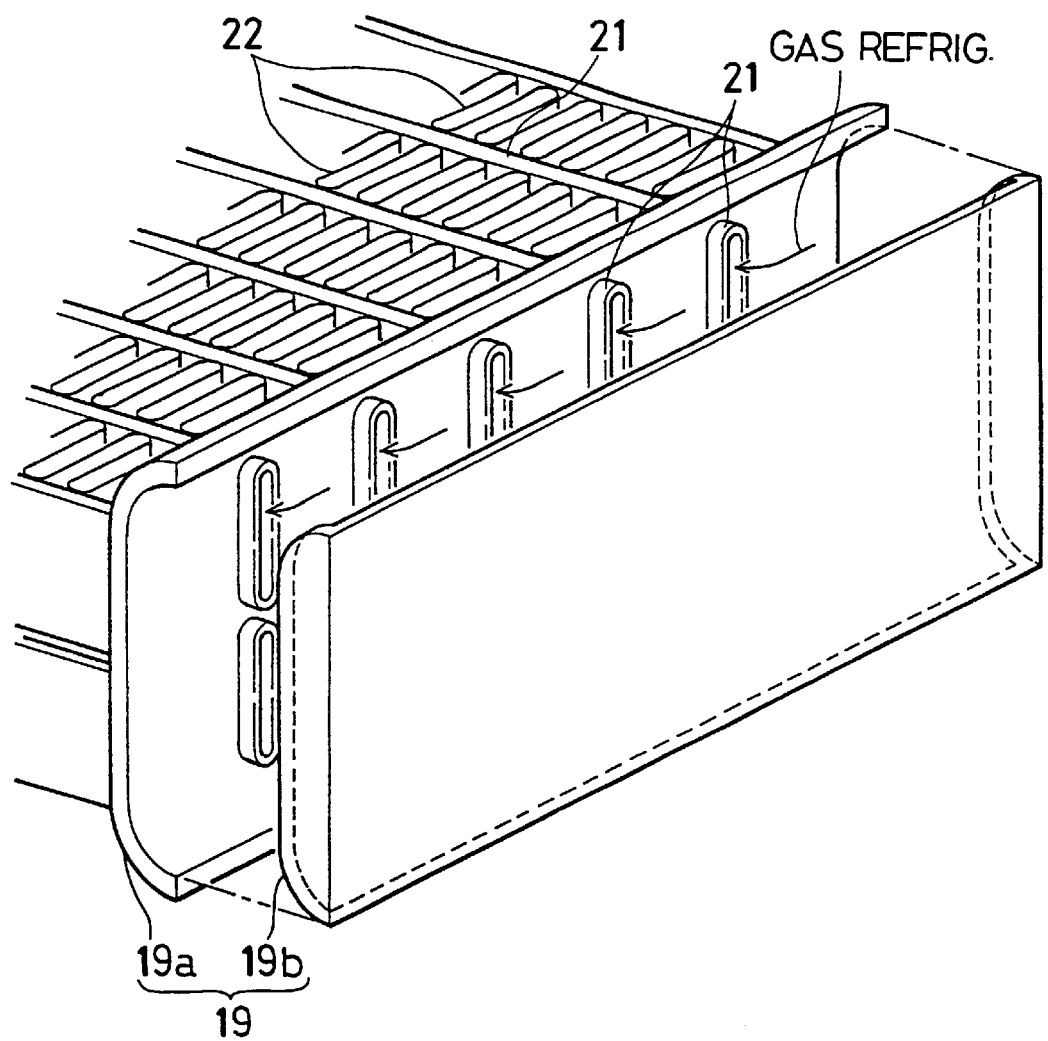
FIG. 14 is a perspective view showing a first header of a radiator according to a sixth preferred embodiment of the present invention.
Figure 15:
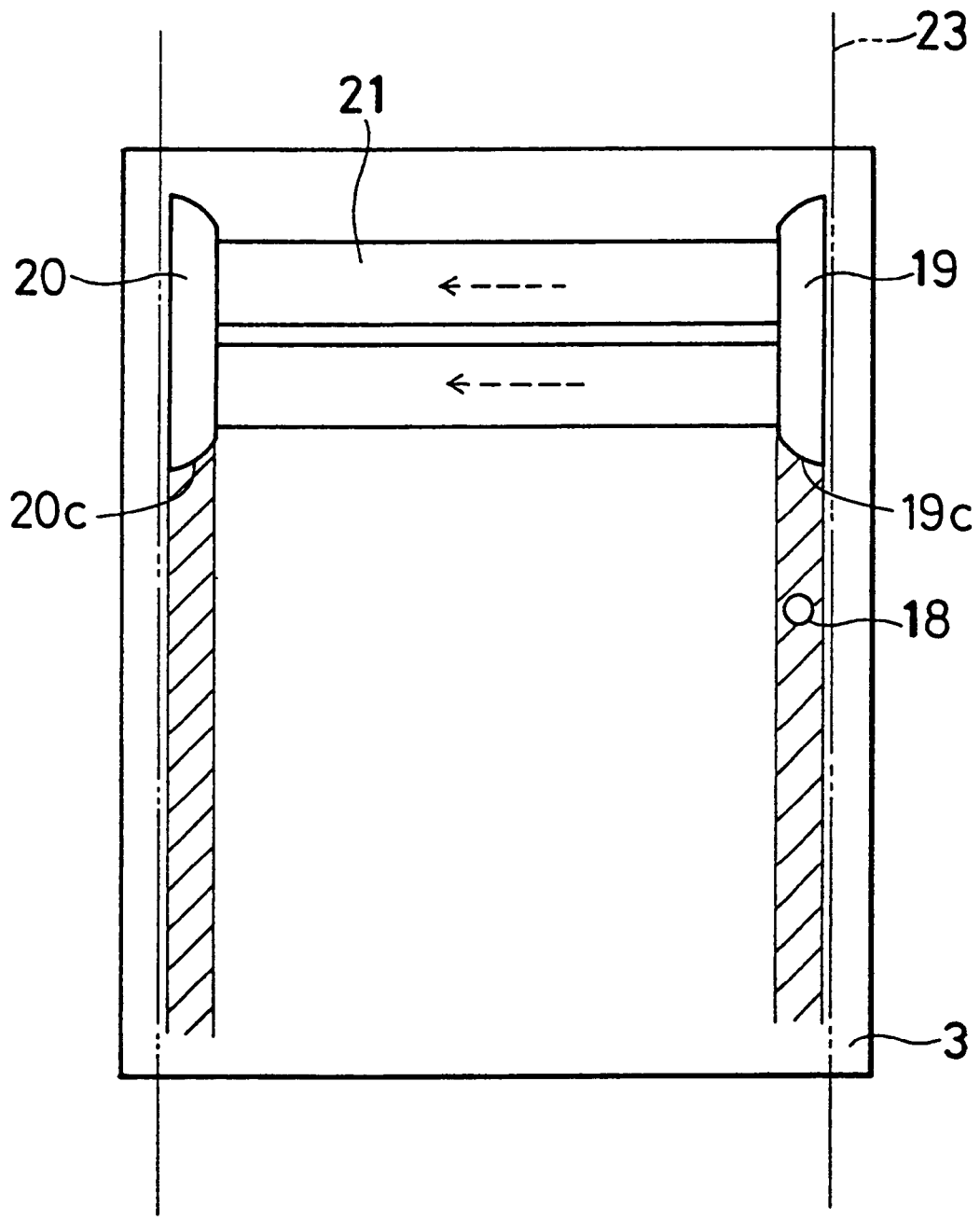
FIG. 15 is a front view showing a cooling device according to the sixth embodiment.
Figure 16:
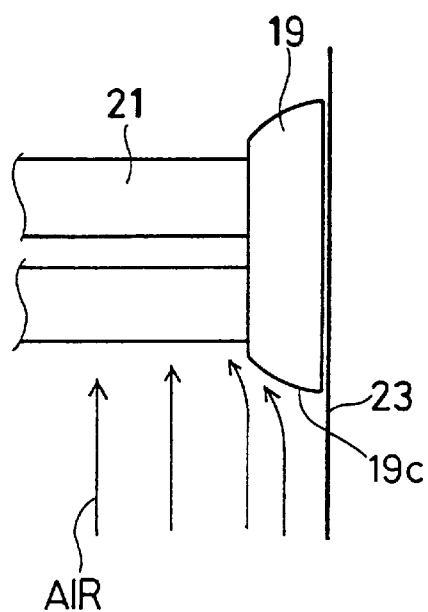
FIG. 16 is a view for explaining a flow of cool air in the first header, according to the sixth embodiment.
Figure 17:
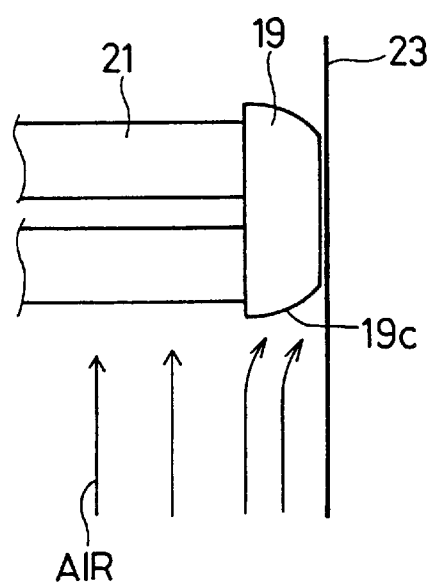
FIG. 17 is a view for explaining a flow of cool air in a first header of a radiator in a comparison example.

A sixth preferred embodiment of the present invention will be described with reference to FIGS. 14–16. As shown in FIGS. 15, 16, both side portions 19c of the first header 19 in a width direction perpendicular to the longitudinal direction of the first header 19 are bent from the first inner header plate 19a toward the first outer header plate 19b to have bent surfaces, respectively. Further, as shown in FIG. 16, the side portions 19c are inclined toward the core portion of the radiator 3 relative to the flow direction of cool air (outside fluid). The first outer header plate 19b is formed into a flat shape. On the other hand, the second header 20 has side portions 20c similar to the side portions 19c of the first header 19, as shown in FIG. 15.

According to the sixth embodiment, the side portions 19c, 20c of the first and second headers 19, 20 are bent outwardly from the first and second inner header plates 19a, 20a, so that the side portions 19c, 20c contacting cool air are bent toward the core portion of the radiator 4 relative to the flow direction of cool air (outside fluid). Therefore, cool air contacting the side portions 19c, 20c of the first and second header 19, 20 flows toward the core portion of the radiator 4. As a result, cool air can be effectively blown toward the core portion of the radiator 4 to effectively cool the gas refrigerant flowing through the radiator tubes 21. It is compared with a comparison example where the side portion 19c is bent to be reduced toward the duct 23 relative to the flow direction of cool air, heat-radiating performance in the radiator 4 can be improved.

According to the sixth embodiment, the side portions 19c, 20c are bent so that cool air contacting the side portions 19c, 20c flows toward the core portion of the radiator 4, and each of the first and second outer header plates 19b, 20b is formed into a flat shape. Therefore, an unnecessary space between the first and second headers 19, 20 and the duct 23 can be made smaller, and the space within the duct 23 can be effectively used.

Further, as shown in FIG. 15, the inlet pipe 18 from which refrigerant is poured into the refrigerant tank 3 is disposed on an extending line of the first header 19 in a vertical direction to be shifted from an extending line of the core portion of the radiator 4. Therefore, the inlet pipe 18 provided in the cover plate 6 does not restrict the flow of cool air flowing through the duct 23. Thus, the inlet pipe 18 can be disposed on the cover plate 6 of the refrigerant tank 3 without increasing the size of the refrigerant tank 3 and without increasing air flow resistance in the duct 3.

Although the present invention has been fully described in connection with preferred embodiments thereof with reference to the accompanying drawings, it is to be noted that various changes and modifications will become apparent to those skilled in the art. Such changes and modifications are to be understood as being within the scope of the present invention as defined by the appended claims.

What is claimed is:

1. A cooling device for boiling and condensing refrigerant for cooling a heat-generating member, said cooling device comprising;

a refrigerant tank for containing liquid refrigerant, said refrigerant tank having first and second wall surfaces disposed approximately vertically to be opposite to each other, and a boiling space between said first and second wall surfaces, in which a part of liquid refrigerant is boiled and vaporized to gas refrigerant by absorbing heat from the heat-generating member attached onto said first wall surface;

a radiator having a first header into which gas refrigerant from said boiling space flows, a plurality of tubes in which gas refrigerant from said first header is cooled and condensed by performing heat exchange with outside fluid passing through said radiator, and a second header through which liquid refrigerant condensed in said tubes returns to said refrigerant tank, wherein:

said second wall surface of the refrigerant tank has a first connection portion communicating with said boiling space at a gas refrigerant outlet, and a second connection portion through which said second header communicates with said boiling space;

said first header is disposed to extend in a tank longitudinal direction approximately horizontally, and is connected to said first connection portion to be approximately perpendicular to said second wall surface;

said second header is connected to said second connection portion to be approximately perpendicular to said second wall surface;

said first header has an inserted end portion being inserted into said refrigerant tank from said first connection portion to form a communication port through which an inner space of said first header communicates with said boiling space;

said first header has a plurality of tube insertion holes arranged in the tank longitudinal direction, into which said tubes are inserted to protrude inside said first header; and said communication port has a lower end at a position lower than the lower end of said tubes inserted into said first header.

2. The cooling device according to claim 1, wherein:

said tubes are arranged in upper and lower two lines between said first and second headers; and said first header has therein a partition wall for partitioning said tubes on the upper line and said tubes on the lower line within said first header.

3. The cooling device according to claim 1, wherein said refrigerant tank and said radiator are integrally connected by brazing.

4. The cooling device according to claim 1, wherein said inserted end portions of said tubes are opened within said first header toward a downstream side in a flow direction of gas refrigerant flowing through said first header.

5. The cooling device according to claim 1, wherein said first header has therein a protrusion protruding inside from an inner surface of said first header.

6. The cooling device according to claim 5, wherein said protrusion is formed into a zigzag shape.

7. The cooling device according to claim 5, wherein said protrusion is disposed to be inclined relative to a flow direction of gas refrigerant flowing through said first header.

8. The cooling device according to claim 5, wherein said protrusion is disposed to contact said inserted end portions of said tubes at an upstream side of said tubes in a flow direction of gas refrigerant flowing through said first header.

9. The cooling device according to claim 1, wherein:

said tubes are laminated to form a core portion between said first and second headers;

said first header has a side wall surface contacting with outside fluid in a flow direction of outside fluid; and said side wall surface is provided in such a manner that outside fluid contacting the side wall surface flows toward said core portion.

10. The cooling device according to claim 9, wherein said side wall surface protrudes from said core portion and is bent toward said core portion to be inclined relative to the flow direction of outside fluid.

11. The cooling device according to claim 9, further comprising:

a duct for defining a fluid passage through which outside fluid flows toward said core portion, wherein said duct is disposed to enclose said first and second headers along outer wall surfaces of said first and second headers.

12. The cooling device according to claim 9, further comprising:

an inlet pipe for pouring refrigerant into said refrigerant tank, wherein said inlet pipe is disposed on said second wall surface.

13. The cooling device according to claim 12, wherein said inlet pipe is disposed on an extending line of said first header in a direction parallel to a flow direction of outside fluid.

14. The cooling device according to claim 12, wherein said inlet pipe is disposed around an extending line of said first header in a direction parallel to a flow direction of outside fluid.

15. The cooling device according to claim 1, wherein:

said tubes are laminated to form a core portion between said first and second headers;

said second header has a side wall surface contacting outside fluid in a flow direction of outside fluid; and said side wall surface of said second header is provided in such a manner that outside fluid contacting the side wall surface flows toward said core portion.

16. The cooling device according to claim 9, wherein:

said first header has an inner plate connected to tubes, and an outer plate opposite to said inner plate and being connected to said inner plate;

said inner plate is connected to said core portion to form said side wall surface contacting outside fluid in the flow direction of outside fluid; and said outside plate has a flat outer wall surface.

17. The cooling device according to claim 1, wherein the first header has an inner bottom surface lower than the lower end of the communication port.

18. A cooling device for boiling and condensing refrigerant for cooling a heat-generating member, said cooling device comprising:

a refrigerant tank for containing liquid refrigerant, said refrigerant tank having first and second wall surfaces disposed approximately vertically to be opposite each other and a boiling space between said first and second wall surfaces in which a part of liquid refrigerant is boiled and vaporized to gas refrigerant by absorbing heat from the heat generating member attached to said first wall surfaces;

a radiator having a first header into which gas refrigerant from said boiling space flows, a plurality of tubes in which gas refrigerant from said first header is cooled and condensed by performing heat exchange with outside fluid passing through said radiator, and a second header through which liquid refrigerant condensed in said tubes returns to said refrigerant tank; wherein:

said first header communicates with said boiling space through a gas refrigerant outlet defined by said second wall surface;

each of said plurality of tubes defining a bore having its lowest end open at a position above said gas refrigerant outlet within said first header such that all liquid refrigerant within said bore of each of said tubes flows into one of said first and second headers.

* * * * *